(12) United States Patent
Lee et al.

(10) Patent No.: US 10,847,981 B2
(45) Date of Patent: Nov. 24, 2020

(54) BATTERY MANAGEMENT METHOD AND APPARATUS

(71) Applicant: Samsung Electronics Co., Ltd., Suwon-si (KR)

(72) Inventors: Sun-Jae Lee, Hwaseong-si (KR); Jeonghyun Park, Seoul (KR); Young Hun Sung, Hwaseong-si (KR)

(73) Assignee: Samsung Electronics Co., Ltd., Swuon-si (KR)

( * ) Notice: Subject to any disclaimer, the term of this patent is extended or adjusted under 35 U.S.C. 154(b) by 66 days.

(21) Appl. No.: 15/987,138

(22) Filed: May 23, 2018

(65) Prior Publication Data
US 2019/0165583 A1   May 30, 2019

(30) Foreign Application Priority Data
Nov. 28, 2017   (KR) .......................... 10-2017-0160401

(51) Int. Cl.
| | |
|---|---|
| *H02J 7/00* | (2006.01) |
| *G01R 35/00* | (2006.01) |
| *G01R 31/396* | (2019.01) |
| *H01M 10/42* | (2006.01) |
| *B60L 58/22* | (2019.01) |

(52) U.S. Cl.
CPC .......... *H02J 7/0018* (2013.01); *G01R 31/396* (2019.01); *G01R 35/00* (2013.01); *H01M 10/425* (2013.01); *H02J 7/0021* (2013.01); *B60L 58/22* (2019.02); *H01M 2010/4271* (2013.01); *H02J 7/0047* (2013.01)

(58) Field of Classification Search
CPC ................................................... H02J 7/0018
USPC ........................................................... 320/134
See application file for complete search history.

(56) References Cited

U.S. PATENT DOCUMENTS

| | | | | |
|---|---|---|---|---|
| 6,501,249 B1 * | 12/2002 | Drori | ............... | H02J 7/0031 320/149 |
| 6,614,232 B1 * | 9/2003 | Mukai | ............... | H01M 10/42 324/426 |

(Continued)

FOREIGN PATENT DOCUMENTS

| | | |
|---|---|---|
| EP | 3 162 609 A1 | 3/2017 |
| GB | 2546789 A | 2/2017 |

(Continued)

OTHER PUBLICATIONS

Extended European Search Report dated Feb. 1, 2019 in corresponding European Patent Appliction No. 18183342.7 (11 pages in English).

*Primary Examiner* — Yalkew Fantu
(74) *Attorney, Agent, or Firm* — NSIP Law (57) ABSTRACT

Disclosed is a battery management method and apparatus that selects a function to be verified from functions of the battery management apparatus, transmits input information used to obtain an execution result information of the selected function to at least one counterpart battery management apparatus, receives, from the counterpart battery management apparatus, reference battery information that is generated by the counterpart battery management apparatus based on the input information, and determines whether an abnormality is present in the selected function based on the execution result information and the received reference battery information.

22 Claims, 9 Drawing Sheets

(56) References Cited

U.S. PATENT DOCUMENTS

| | | | |
|---|---|---|---|
| 7,081,737 B2 | 7/2006 | Liu et al. | |
| 7,579,842 B2 * | 8/2009 | Hunter | H02J 7/0019 320/103 |
| 8,723,483 B2 * | 5/2014 | Shimizu | H02J 7/0016 320/122 |
| 2007/0108946 A1 * | 5/2007 | Yamauchi | H01M 10/42 320/132 |
| 2010/0079146 A1 * | 4/2010 | Kurose | B60L 3/0046 324/433 |
| 2010/0259221 A1 | 10/2010 | Tabatowski-Bush | |
| 2011/0080138 A1 * | 4/2011 | Nakanishi | H02J 7/0016 320/116 |
| 2015/0123595 A1 * | 5/2015 | Hussain | H02J 7/0052 320/107 |
| 2015/0325886 A1 | 11/2015 | Butzmann | |

FOREIGN PATENT DOCUMENTS

| | | |
|---|---|---|
| JP | 2005-108543 A | 4/2005 |
| JP | 2008-224265 A | 9/2008 |
| JP | 2011-205827 A | 10/2011 |
| KR | 10-1326508 B1 | 11/2013 |
| KR | 10-1527136 B1 | 6/2015 |
| KR | 10-1745167 B1 | 6/2017 |

\* cited by examiner

BATTERY MANAGEMENT METHOD AND APPARATUS

CROSS-REFERENCE TO RELATED APPLICATIONS

This application claims the benefit under 35 USC § 119(a) of Korean Patent Application No. 10-2017-0160401 filed on Nov. 28, 2017 in the Korean Intellectual Property Office, the entire disclosure of which is incorporated herein by reference for all purposes.

BACKGROUND

Field

The following description relates to battery management method and apparatus.

Description of Related Art

A battery management system manages a battery serving as a power source to an electronic device. When the battery management system malfunctions, the battery management system is unable to accurately manage the battery.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a battery management method performed by a battery management apparatus, the method includes selecting a function to be verified from plural functions of the battery management apparatus, transmitting input information used to obtain execution result information of the selected function to at least one counterpart battery management apparatus, receiving, from the counterpart battery management apparatus, reference battery information that is generated by the counterpart battery management apparatus based on the input information, and determining whether an abnormality is present in the selected function based on the execution result information and the received reference battery information.

The determining of whether the abnormality is present in the selected function may include calculating a statistic value based on the execution result information and the reference battery information and determining that the abnormality is present in the selected function in response to the calculated statistic value being greater than a threshold.

The calculated statistic value may include a deviation or a standard deviation of the execution result information and the reference battery information.

The battery management method may further include determining substitute battery information based on the execution result information and the reference battery information in response to a determination that the abnormality is present in the selected function, and changing the execution result information to the determined substitute battery information.

The substitute battery information may correspond to a result of a calculation performed based on information selected from the execution result information and the reference battery information.

The substitute battery information may correspond to an average of the execution result information and the reference battery information.

The selecting may include selecting a function corresponding to a current ordinal position for verification by referencing a table in which a verification order of a portion or all of the plural functions is recorded.

The counterpart battery management apparatus may be selected by the battery management apparatus from battery management apparatuses based on at least one of a response speed and identification information of each of the battery management apparatuses.

A main board of the battery management apparatus may differ from a main board of the counterpart battery management apparatus.

A non-transitory computer-readable storage medium may store instructions that, when executed by one or more processors, cause the one or more processors to perform the battery management method.

In another general aspect, a battery management apparatus includes one or more processors configured to select a function to be verified from plural functions of the battery management apparatus, transmit input information used to obtain execution result information of the selected function to at least one counterpart battery management apparatus, receive, from the counterpart battery management apparatus, reference battery information that is generated by the counterpart battery management apparatus based on the input information, and determine whether an abnormality is present in the selected function based on the execution result information and the received reference battery information.

The one or more processor may be configured to calculate a statistic value based on the execution result information and the reference battery information and determine that the abnormality is present in the selected function in response to the calculated statistic value being greater than a threshold.

The calculated statistic value may include a deviation or a standard deviation of the execution result information and the reference battery information.

In response to a determination that the abnormality is present in the selected function, the one or more processor may be configured to determine substitute battery information based on the execution result information and the reference battery information and change the execution result information to the determined substitute battery information.

The substitute battery information may correspond to a result of a calculation performed based on information selected from the execution result information and the reference battery information.

The substitute battery information may correspond to an average of the execution result information and the reference battery information.

The one or more processor may be configured to select a function corresponding to a current ordinal position for verification by referencing a table in which a verification order of a portion or all of the plural functions is recorded.

The counterpart battery management apparatus may be selected by the one or more processor from battery management apparatuses based on at least one of a response speed and identification information of each of the battery management apparatuses.

A main board of the battery management apparatus may differ from a main board of the counterpart battery management apparatus.

In still another general aspect, a battery management system includes a battery management apparatus and at least one counterpart battery management apparatus configured to communicate with the battery management apparatus, wherein the battery management apparatus is configured to select a function to be verified from plural functions of the battery management apparatus, transmit input information used to obtain execution result information of the selected function to at least one counterpart battery management apparatus, receive, from the counterpart battery management apparatus, reference battery information that is generated by the counterpart battery management apparatus based on the input information, and determine whether an abnormality is present in the selected function based on the execution result information and the received reference battery information.

The battery management apparatus may be configured to calculate a statistic value based on the execution result information and the reference battery information and determine that the abnormality is present in the selected function in response to the calculated statistic value being greater than a threshold.

The calculated statistic value may include a deviation or a standard deviation of the execution result information and the reference battery information.

In response to a determination that the abnormality is present in the selected function, the battery management apparatus may be configured to determine substitute battery information based on the execution result information and the reference battery information and change the execution result information to the determined substitute battery information.

The substitute battery information may correspond to a result of a calculation performed based on information selected from the execution result information and the reference battery information.

The substitute battery information may correspond to an average of the execution result information and the reference battery information.

The battery management apparatus may be configured to select a function corresponding to a current ordinal position for verification by referencing a table in which a verification order of a portion or all of the plural functions is recorded.

The counterpart battery management apparatus may be selected by the one or more processor from battery management apparatuses based on at least one of a response speed and identification information of each of the battery management apparatuses.

A main board of the battery management apparatus may differ from a main board of the counterpart battery management apparatus.

In another general aspect, a battery system includes batteries and plural battery management apparatuses. The plural battery management apparatuses are connected to the batteries, respectively. Each of the battery management apparatuses is configured to perform a first function on a first battery to obtain a first execution result; select at least one counterpart battery management apparatus, from among the plural battery management apparatuses, to perform the first function on the first battery to obtain a counterpart execution result; and determine whether the first execution result is abnormal based on the counterpart execution result.

A first battery management apparatus may be further configured to substitute a corresponding first execution result for a corresponding counterpart execution result when the corresponding first result is determined to be abnormal.

The selecting of the at least one counterpart battery management apparatus may include selecting multiple counterpart battery management apparatuses to perform the first function on the first battery.

Respective execution results of the plural multiple counterpart battery management apparatuses for the first function may be used to calculate a statistic value to obtain the counterpart execution result.

The battery management apparatus may be further configured to perform a second function.

The first function or the second function may be any one or any combination of any two or more of a sensing function, a state estimating function, and a cell balancing function.

Other features and aspects will be apparent from the following detailed description, the drawings, and the claims.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Unless otherwise defined, all terms, including technical and scientific terms, used herein have the same meaning as commonly understood by one of ordinary skill in the art to which this disclosure pertains. Terms, such as those defined in commonly used dictionaries, are to be interpreted as having a meaning that is consistent with their meaning in the context of the relevant art, and are not to be interpreted in an idealized or overly formal sense unless expressly so defined herein.

Regarding the reference numerals assigned to the elements in the drawings, it should be noted that the same elements will be designated by the same reference numerals, wherever possible, even though they are shown in different drawings. Also, in the description of embodiments, detailed description of well-known related structures or functions will be omitted when it is deemed that such description will cause ambiguous interpretation of the present disclosure.

Figure 1:
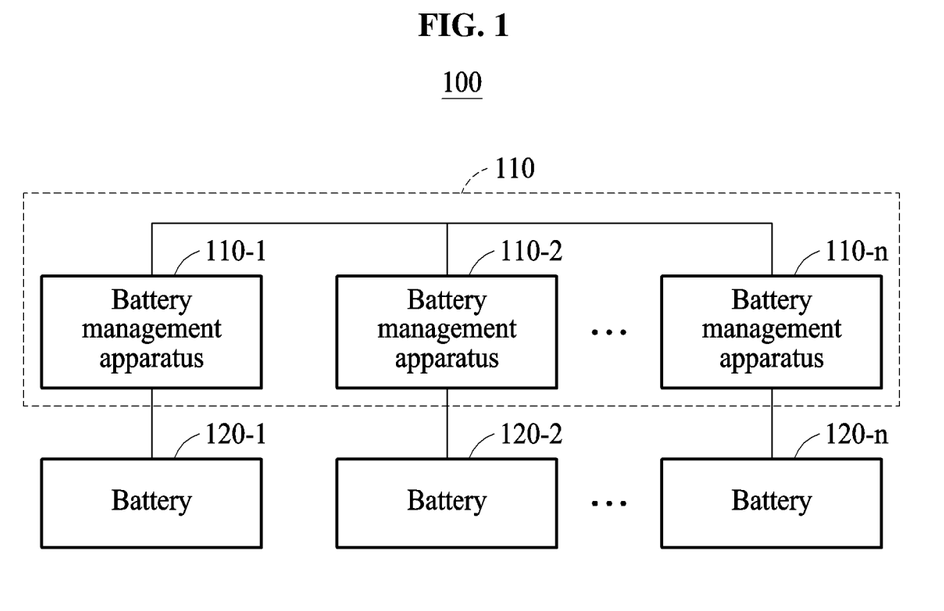
FIG. 1 illustrates an example of a battery system.

FIG. 1 illustrates an example of a battery system.

Referring to FIG. 1, a battery system 100 includes a battery management system 110 and batteries 120-1 through 120-$n$.

Each of the batteries 120-1 through 120-$n$ is, for example, at least one battery cell, at least one battery module, and at least one battery pack.

The battery management system 110 includes battery management apparatuses 110-1 through 110-$n$. Each of the battery management apparatuses 110-1 through 110-$n$ may perform various functions. For example, the functions may include any one or any combination of any two or more of a sensing function, a state estimating function, and a cell balancing function. The battery management apparatus 110-1 senses the battery 120-1 using at least one sensor to collect sensing data of the battery 120-1. The sensing data includes, for example, any one or any combination of two or more of voltage data, current data, and temperature data. Also, the battery management apparatus 110-1 estimates a state of the battery 120-1 based on the sensing data of the battery 120-1. The state includes, for example, either one or both of a state of charge (SOC) and a state of health (SOH).

When execution of any one or a combination of any two or more functions is completed, at least one of the battery management apparatuses 110-1 through 110-$n$ may verify a function corresponding to a current ordinal position for verification in cooperation with at least one counterpart battery management apparatus. In an example, when execution of the functions of the battery management apparatus 110-1 is completed, the battery management apparatus 110-1 verifies an SOC estimating function corresponding to a current ordinal position for verification in cooperation with at least one counterpart battery management apparatus. Through the verification, the battery management apparatus 110-1 determines whether an abnormality or a fault is present in the SOC estimating function. When it is determined that an abnormality is present in the SOC estimating function, the battery management apparatus 110-1 changes the result of an execution of the SOC estimating function to substitute battery information from counterpart battery management apparatuses to avoid the result. Through this, the battery management apparatus 110-1 ensures an integrity of the functions. After the verification and avoidance operations, the battery management apparatus 110-1 continues performing its other functions. When the execution of the functions is completed, the battery management apparatus 110-1 verifies a function corresponding to a subsequent ordinal position for verification in cooperation with at least one counterpart battery management apparatus.

In an example, the battery management apparatuses 110-1 through 110-$n$ have different main boards or a printed circuitry boards (PCBs). A main board of the battery management apparatus 110-1 differs from a main board of at least one counterpart battery management apparatus. For example, an apparatus for verifying a function of the battery management apparatus 110-1 and the battery management apparatus 110-1 may be implemented as a multi-core processor on a single main board. In this example, when a failure occurs in the main board, it is difficult to determine whether an abnormality is present in the function of the battery management apparatus 110-1, so that the integrity may not be guaranteed in the battery management apparatus 110-1. For this reason, the battery management apparatuses 110-1 through 110-$n$ have different main boards.

Hereinafter, verification and avoidance operations of the battery management apparatus 110-1 will be further described with reference to FIGS. 2 through 5. The following description is also applicable to each of the battery management apparatuses 110-2 through 110-$n$.

FIGS. 2 through 5 illustrate examples of an operation of a battery management apparatus.

Figure 2:
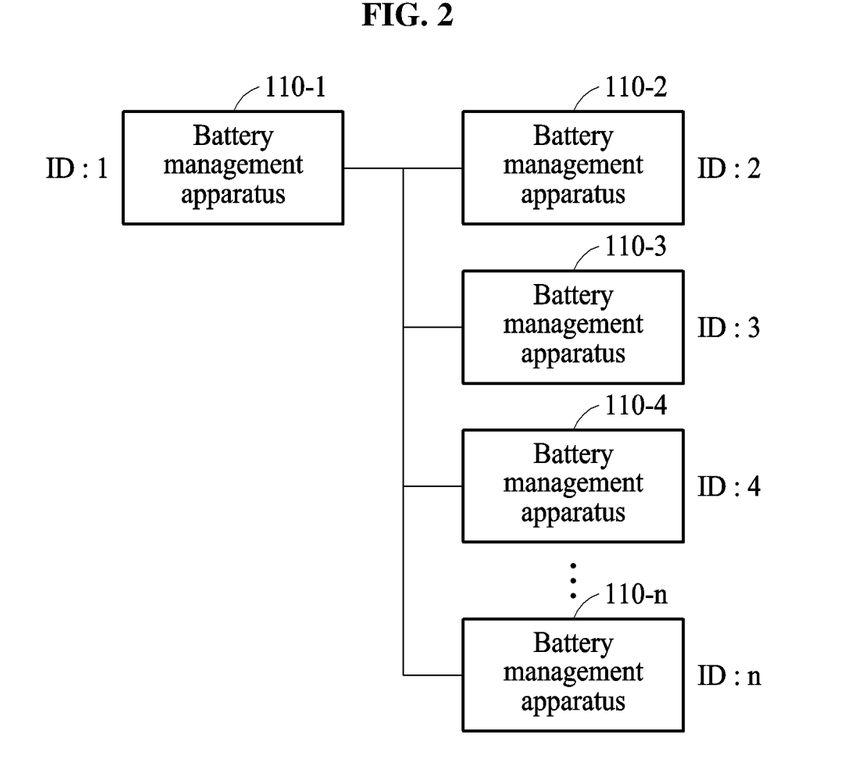
FIGS. 2 through 5 illustrate examples of an operation of a battery management apparatus.

Referring to FIG. 2, the battery management apparatus 110-1 communicates with each of the battery management apparatuses 110-2 through 110-$n$. Through such communication, the battery management apparatus 110-1 acquires identification information of each of the battery management apparatuses 110-2 through 110-$n$. In other words, the battery management apparatus 110-1 receives the identification information from each of the battery management apparatuses 110-2 through 110-$n$. In the example of FIG. 2, when the battery management apparatuses 110-1 through 110-$n$ have respective identification information as listed on Table 1, the battery management apparatus 110-1 receives identification information of 2 from the battery management apparatus 110-2 and receives identification information of 3 from the battery management apparatus 110-3. Likewise, the battery management apparatus 110-1 receives identification information from each of the battery management apparatuses 110-4 through 110-$n$.

TABLE 1

| Battery management apparatus | Identification information |
| --- | --- |
| Battery management apparatus 110-1 | 1 |
| Battery management apparatus 110-2 | 2 |
| Battery management apparatus 110-3 | 3 |
| . . . | . . . |
| Battery management apparatus 110-n | n |

The battery management apparatus 110-1 selects at least one counterpart battery management apparatus from the battery management apparatuses 110-2 through 110-$n$. The battery management apparatus 110-1 may select at least one counterpart battery management apparatus from the battery management apparatuses 110-2 through 110-$n$ based on either one or both of a response speed and the identification information of each of the battery management apparatuses 110-2 through 110-$n$. The number of counterpart battery management apparatuses to be selected by the battery management apparatus 110-1 may be determined in advance. For example, the battery management apparatus 110-1 may select two counterpart battery management apparatuses. In this example, the battery management apparatus 110-1 selects the battery management apparatus 110-2 corresponding to the identification (ID) information of 2 having the smallest index difference from ID information of 1. Also, the battery management apparatus 110-1 selects the battery management apparatus 110-3 corresponding to the ID information of 3 having the next smallest difference from the ID information of 1, e.g., respective first, second and third ID information of the battery management apparatuses 110-1, 110-2, and 110-3 are indices, incrementally different each from the other. Also, the battery management apparatus 110-1 calculates the response speed of each of the battery management apparatuses 110-2 through 110-$n$ by communicating with each of the battery management apparatuses 110-2 through 110-$n$. The battery management apparatus 110-1 selects one or more battery management apparatuses having determined relatively high response speeds, i.e., relative to other response speeds of other battery management apparatuses, as counterpart battery management apparatuses.

When the battery management apparatuses 110-1 through 110-$n$ are powered on, the battery management apparatus 110-1 selects at least one counterpart battery management apparatus from the battery management apparatuses 110-2 through 110-$n$. For example, when a vehicle is started, power is supplied to the battery management apparatuses 110-1 through 110-$n$ in the vehicle. In this example, the battery management apparatuses 110-1 through 110-$n$ communicates with one another. The battery management apparatus 110-1 selects at least one counterpart battery management apparatuses from the battery management apparatuses 110-2 through 110-$n$ based on either one or both of the response speed and the identification information of each of the battery management apparatuses 110-2 through 110-$n$.

The battery management apparatus 110-1 performs its intended functions. The functions may include, for example, a function to sense the battery 120-1, a function to estimate a state of the battery 120-1, and a function to control a temperature of the battery 120-1. Among the functions, one or more functions to be verified or determined as a fundamental function may be recorded in a table. When execution of the functions is completed and recorded in a table, the battery management apparatus 110-1 selects a function from the functions recorded in the table and verifies the selected function. Depending on examples, when the execution of the functions is completed, the battery management apparatus 110-1 verifies at least two or all of the functions recorded in the table.

Figure 3:
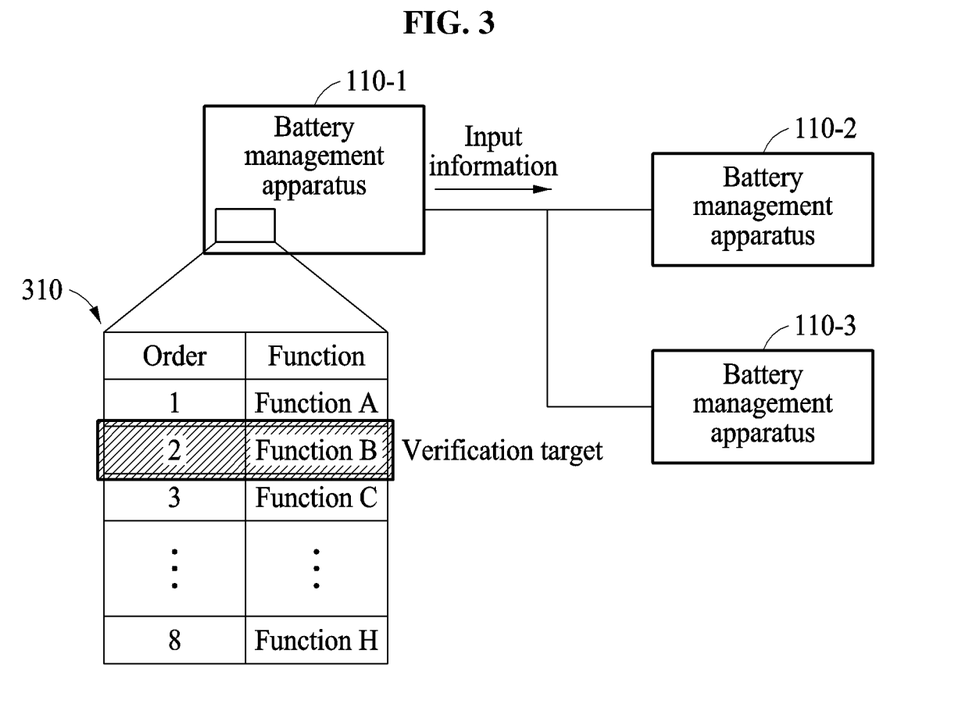

Referring to FIG. 3, in the example depicted, the battery management apparatus 110-1 selects a Function B corresponding to a current ordinal position for verification or a current verification target by referencing a table 310 in which functions A through H corresponding to verification targets and an order of the functions A through H. The battery management apparatus 110-1 transmits input information used to obtain execution result of the selected Function B to at least one counterpart battery management apparatus. In other words, the battery management apparatus 110-1 and the counterpart battery management apparatus share the input information. When the Function B is a function to estimate an SOC of the battery 120-1, the battery management apparatus 110-1 transmits sensing data (for example, voltage data, current data, and/or temperature data of the battery 120-1) used to obtain estimation information $SOC_{t\_1}$ #1 on the SOC of the battery 120-1 to the battery management apparatuses 110-2 and 110-3. In "$SOC_{t\_1}$, #1", the subscript t denotes a point in time, the subscript 1 denotes identification information of the battery 120-1, and #1 indicates that the estimation information on the SOC of the battery 120-1 is obtained by the battery management apparatus 110-1. In this example, each of the battery management apparatuses 110-2 and 110-3 is a counterpart battery management apparatus.

Each of the battery management apparatuses 110-2 and 110-3 generates reference battery information based on input information received from the battery management apparatus 110-1. Each of the battery management apparatuses 110-2 and 110-3 performs the same function as the Function B of the battery management apparatus 110-1 to generate the reference battery information corresponding to the received input information. When sensing data of the battery 120-1 is received from the battery management apparatus 110-1, each of the battery management apparatuses 110-2 and 110-3 generates reference battery information on the SOC of the battery 120-1 based on the sensing data of the battery 120-1. The battery management apparatus 110-2 generates reference battery information $SOC_{t\_1}$ #2 on the SOC of the battery 120-1 based on the sensing data of the battery 120-1. The battery management apparatus 110-3 generates reference battery information $SOC_{t\_1}$ #3 on the SOC of the battery 120-1 based on the sensing data of the battery 120-1.

Figure 4:
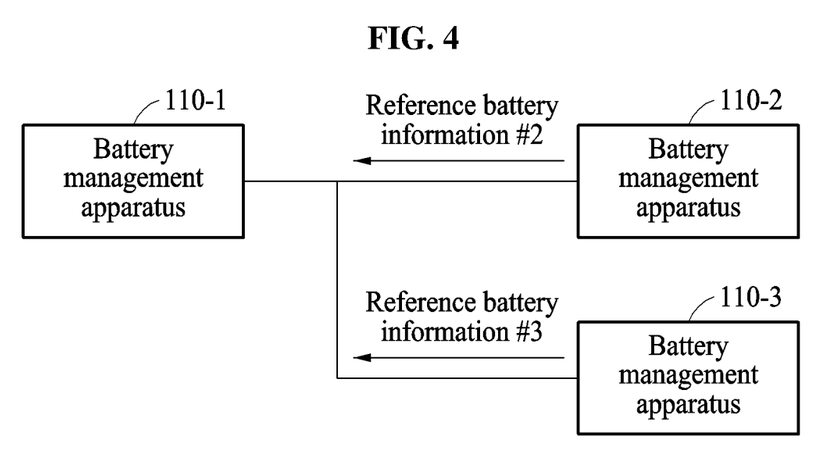

When the reference battery information is generated, the counterpart battery management apparatus transmits the reference battery information to the battery management apparatus 110-1. As illustrated in FIG. 4, when reference battery information #2 is generated, the battery management apparatus 110-2 transmits the reference battery information #2 to the battery management apparatus 110-1. When reference battery information #3 is generated, the battery management apparatus 110-3 transmits the reference battery information #3 to the battery management apparatus 110-1. In the example of FIG. 3, the battery management apparatus 110-2 transmits the reference battery information $SOC_{t\_1}$ #2 to the battery management apparatus 110-1. Also, the battery management apparatus 110-3 transmits the reference battery information $SOC_{t\_1}$ #3 to the battery management apparatus 110-1.

The battery management apparatus 110-1 determines whether an abnormality is present in the Function B based on execution result information of the Function B and reference battery information received from the counterpart battery management apparatuses. The battery management apparatus 110-1 verifies whether the Function B is normally executed based on the execution result information of the Function B and the reference battery information. When the execution result information of the Function B is $SOC_{t\_1}$ #1, the reference battery information #2 is $SOC_{t\_1}$ #2 and the reference battery information #3 is $SOC_{t\_1}$, #3, the battery management apparatus 110-1 calculates a statistic value of $SOC_{t\_1}$ #1, $SOC_{t\_1}$ #2, and $SOC_{t\_1}$ #3. When the statistic value is greater than or equal to a threshold, the battery management apparatus 110-1 determines that an abnormality is present in the Function B. In this example, the statistic value includes a deviation or a standard deviation of $SOC_{t\_1}$, #1, $SOC_{t\_1}$ #2, and $SOC_{t\_1}$ #3.

Figure 5:
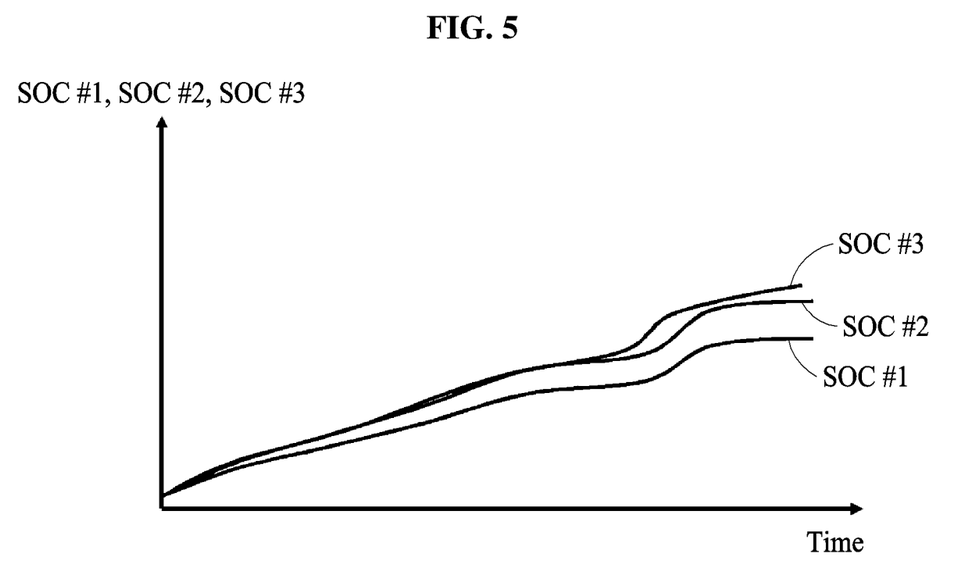

The battery management apparatus 110-1 may determine whether an abnormality is present in the Function B based on history information including the execution result information of the Function B and reference history information of the counterpart battery management apparatuses. FIG. 5 illustrates graphs of SOC #1, SOC #2, and SOC #3, SOC #1 as a function of time to define history information of an execution result of the Function B of the battery management apparatus 110-1. SOC #2 representing reference history information of the battery management apparatus 110-2, and SOC #3 representing reference history information of the battery management apparatus 110-3. Here, SOC #1 includes $SOC_{t\_1}$ #1 and previous information such as $SOCO_{t-1\_1}$ #1, $SOC_{t-2\_1}$ #1, and the like. Similarly, SOC #2 includes $SOCO_{t\_1}$ #2 and previous reference battery information such as $SOC_{t-1\_1}$ #2. Also, SOC #3 includes $SOC_{t\_1}$ #3 and previous reference battery information such as $SOC_{t\_1}$ #3. In this example of FIG. 5, SOC #2 is determined to be substantially the same as SOC #3 or insignificantly different from SOC #3 while SOC #1 is different from SOC #2 and SOC #3. The difference between SOC #2 and SOC #3 falls within a predetermined threshold while the difference between SOC #1 to either SOC #2 or SOC #3 exceeds the predetermined threshold. In this example, an SOC estimating function is Function B, and the battery management apparatus 110-1 determines that an abnormality exists in the SOC estimating function of the battery management apparatus 110-1.

When it is determined that an abnormality is present in the Function B, the battery management apparatus 110-1 calculates differences between $SOC_{t\_1}$ #1, $SOC_{t\_1}$ #2, and $SOC_{t\_1}$ #3. For example, the battery management apparatus 110-1 calculates a difference diff 1 between $SOC_{t\_1}$ #1 and $SOC_{t\_1}$ #2, a difference diff 2 between $SOC_{t\_1}$ #2 and $SOC_{t\_1}$ #3, and a difference diff 3 between $SOC_{t\_1}$ #1 and $SOC_{t\_1}$ #3. The battery management apparatus 110-1 selects the smallest difference from the calculated differences and determines the result of the SOC calculation performed based on SOCs associated with the selected difference; thus, replacing the original SOC value calculated by the battery management apparatus 110-1 with the substitute battery information. When the difference diff 2 is the smallest among the differences diff 1, diff 2, and diff 3, the battery management apparatus 110-1 determines an average of $SOC_{t\_1}$ #2 and $SOC_{t\_1}$ #3 associated with the difference diff 2 to be the substitute battery information replacing the original SOC value calculated by the battery management apparatus 110-1. Depending on examples, the battery management apparatus 110-1 determines an average of $SOC_{t\_1}$ #1, $SOC_{t\_1}$ #2, and $SOC_{t\_1}$ #3 to be the substitute battery information.

The battery management apparatus 110-1 changes SOC estimation information of the battery 120-1 from $SOC_{t\_1}$ #1 to the average of $SOC_{t\_1}$ #2 and $SOC_{t\_1}$ #3 based on the relatively low accuracy of $SOC_{t\_1}$ #1. The battery management apparatus 110-1 changes the SOC estimation information of the battery 120-1 from $SOC_{t\_1}$ #1 to the average of $SOC_{t\_1}$ #2 and $SOC_{t\_1}$ #3. In other words, the battery management apparatus 110-1 avoids using the calculated $SOC_{t\_1}$ #1 in favor of the determined average of $SOC_{t\_1}$ #2 and $SOC_{t\_1}$ #3 to be the SOC estimation information of the battery 120-1. The battery management apparatus 110-1 may provide the average between $SOC_{t\_1}$ #2 and $SOC_{t\_1}$ #3 to another device, for example, an electronic control unit (ECU) and a vehicle control unit (VCU).

After the verification and avoidance of the results of Function B, the battery management apparatus 110-1 resumes its battery management functions. When the execution of a next function is completed, the battery management apparatus 110-1 verifies a function, which may be, for example, a Function C recorded in the table 310 corresponding to a subsequent ordinal position for verification.

The battery management apparatus 110-1 uses each of the battery management apparatuses 110-2 and 110-3 as a counterpart battery management apparatus to verify the function corresponding to the subsequent ordinal position for verification. The battery management apparatus 110-1 may verify the function corresponding to a subsequent ordinal position for verification in cooperation with the battery management apparatuses 110-2 and 110-3 without need to select the counterpart battery management apparatuses. Depending on examples, the battery management apparatus 110-1 selects at least one counterpart battery management apparatus from the battery management apparatuses 110-2 through 110-n and verifies the function corresponding to the subsequent ordinal position for verification in cooperation with the selected counterpart battery management apparatus.

Figure 6:
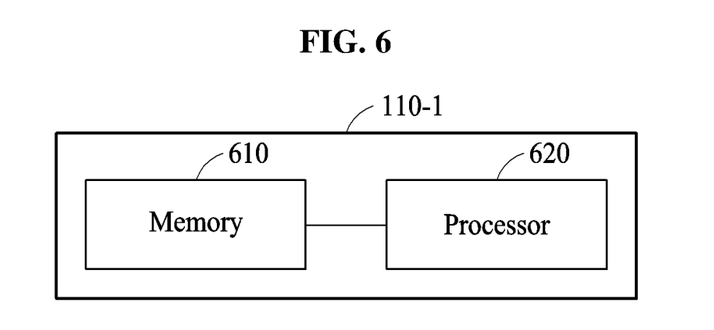
FIG. 6 illustrates an example of a battery management apparatus.

FIG. 6 illustrates an example of a battery management apparatus.

Referring to FIG. 6, the battery management apparatus 110-1 includes a memory 610 and a processor 620.

The memory 610 stores a table. In the table, functions corresponding to verification targets and a verification order of the functions are recorded.

In an example, the processor 620 selects a function to be verified from functions of the battery management apparatus 110-1. The processor 620 selects, for example, an SOC estimating function corresponding to a current ordinal position for verification by referencing the table stored in the memory 610.

The processor 620 transmits input information used to obtain execution result information of the selected function to at least one counterpart battery management apparatus. For example, the processor 620 may transmit sensing data used to obtain $SOC_{t\_1}$ #1 corresponding to execution result information of the selected SOC estimating function to at least one counterpart battery management apparatus.

The processor 620 receives reference battery information from the counterpart battery management apparatus. The reference battery information is, for example, information generated by the counterpart battery management apparatus based on the input information. In an example, the processor 620 receives $SOC_{t\_1}$ #2 from the battery management apparatus 110-2 and receives $SOC_{t\_1}$ #3 from the battery management apparatus 110-3.

The processor 620 determines whether an abnormality is present in the selected function based on the execution result information of the selected function and the received reference battery information. For example, the processor 620 may calculate a statistic value based on the execution result information of the selected function and the received reference battery information. In an example, when the calculated statistic value is greater than a threshold, the processor 620 determines that the abnormality is present in the selected function.

When it is determined that an abnormality is present in the selected function, the processor 620 determines substitute battery information based on the execution result information of the selected function and the received reference battery information, and changes the execution result information of the selected function to the substitute battery information. The substitute battery information corresponds to a result of a calculation performed based on information selected from the execution result information of the selected function and the reference battery information. For example, $SOC_{t\_1}$ #2 and $SOC_{t\_1}$ #3 are selected amongst $SOC_{t\_1}$ #1, $SOC_{t\_1}$ #2, and $SOC_{t\_1}$ #3 because a difference between $SOC_{t\_1}$ #2 and $SOC_{t\_1}$ #3 is calculated to be the smallest. In this example, an average of $SOC_{t\_1}$ #2 and $SOC_{t\_1}$ #3 corresponds to the substitute battery information.

Since the description of FIGS. 1 through 5 is also applicable here, repeated description of FIG. 6 will be omitted.

Figure 7:
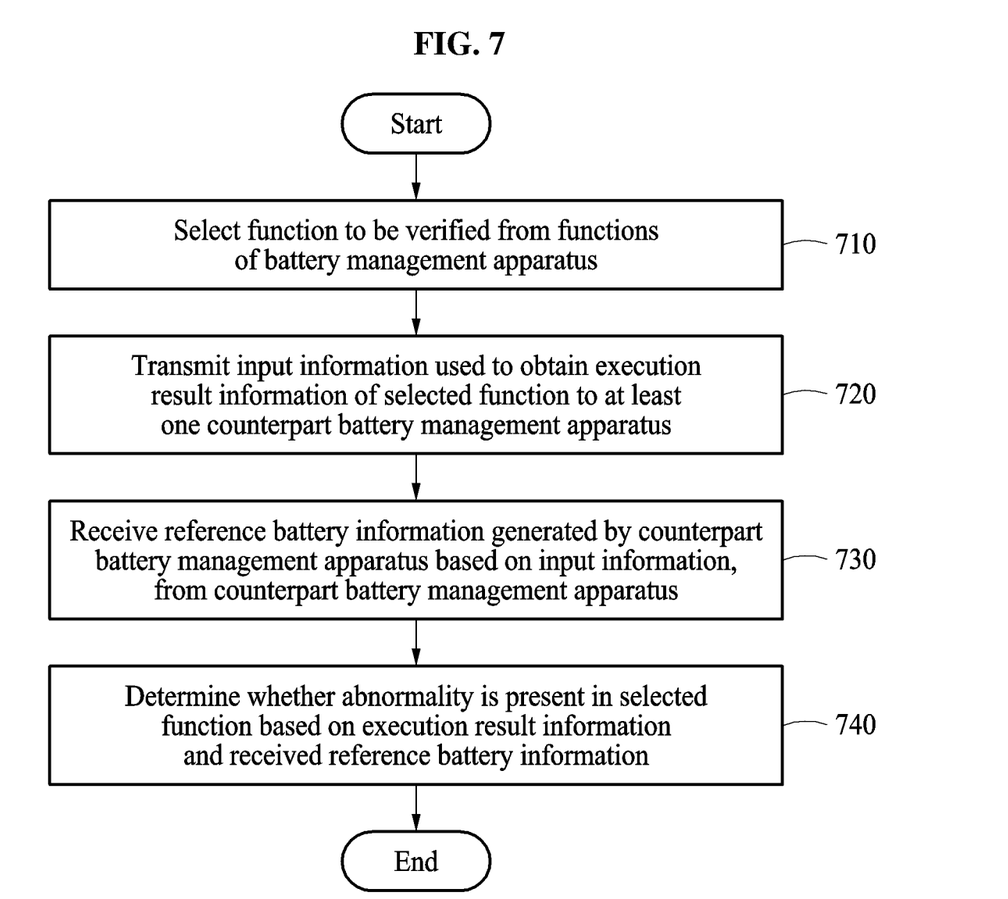
FIG. 7 illustrates an example of a battery management method.

FIG. 7 illustrates an example of a battery management method.

A battery management method is performed by the battery management apparatus 110-1, for example. Also, the battery management method is implemented through one or more processors configured to process software instructions in an operating system or firmware.

Referring to FIG. 7, in operation 710, the battery management apparatus 110-1 selects a function to be verified from functions of the battery management apparatus 110-1.

In operation 720, the battery management apparatus 110-1 transmits input information used to obtain execution result information of the selected function to at least one counterpart battery management apparatus.

In operation 730, the battery management apparatus 110-1 receives reference battery information generated by the counterpart battery management apparatus based on the input information, from the counterpart battery management apparatus.

In operation 740, the battery management apparatus 110-1 determines whether an abnormality is present in the selected function based on the execution result information of the selected function and the received reference battery information.

Since the description of FIGS. 1 through 6 is also applicable here, repeated description of FIG. 7 will be omitted.

The battery management apparatus 110-1 may be representative of, or included in various apparatuses, for example, a vehicle, a walking assistance device, a drone, and a mobile terminal and configured to perform the operations described with reference to FIG. 1 through 7. Hereinafter, examples of the battery management apparatus 110-1 installed in a vehicle will be described with reference to FIGS. 8 and 9. The following description is also applicable to other apparatuses in addition to the vehicle.

Figure 8:
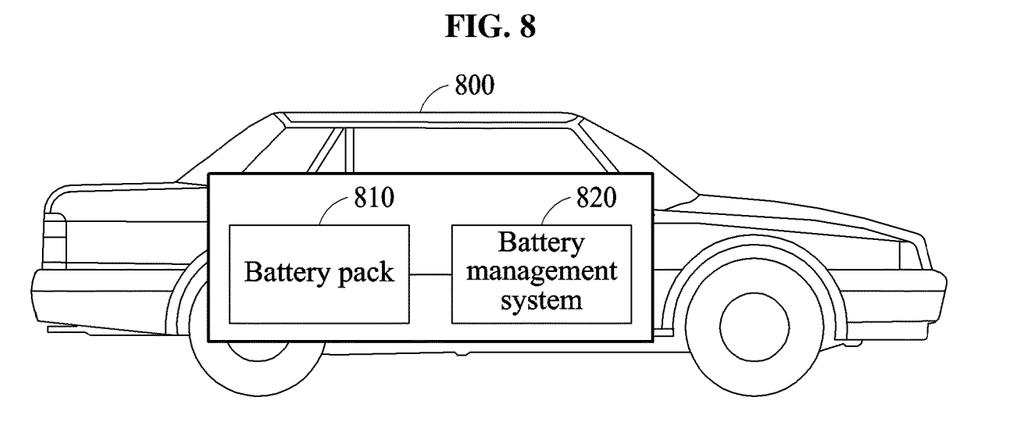
FIGS. 8 and 9 illustrate examples of a vehicle.
Figure 9:
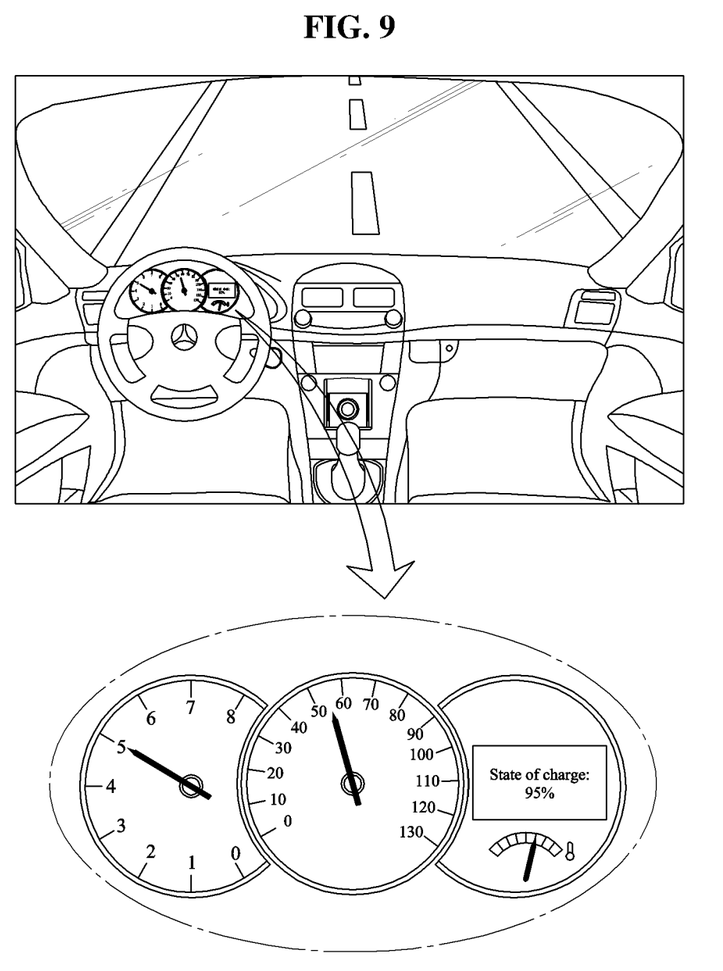

FIGS. 8 and 9 illustrate examples of a vehicle.

Referring to FIG. 8, a vehicle 800 includes a battery pack 810 and a battery management system 820. The vehicle 800 uses the battery pack 810 as a power source. The vehicle 800 is, for example, an electric vehicle or a hybrid vehicle.

The battery pack 810 includes the batteries 120-1 through 120-$n$.

The battery management system 820 includes the battery management apparatuses 110-1 through 110-$n$. The battery management apparatuses 110-1 through 110-$n$ respectively estimate states of the batteries 120-1 through 120-$n$. When the states of the batteries 120-1 through 120-$n$ are estimated, at least one of the battery management apparatuses 110-1 through 110-$n$ performs the operations described with reference to FIGS. 1 through 7.

When the vehicle 800 is started, the battery management apparatus 110-1 communicates with the battery management apparatuses 110-2 through 110-$n$ and selects the battery management apparatuses 110-2 and 110-3 as counterpart battery management apparatuses. The battery management apparatus 110-1 obtains $SOC_{t\_1}$ #1 as SOC estimation information of the battery 120-1. Also, the battery management apparatus 110-1 verifies an SOC estimating function in cooperation with other battery management apparatuses, for example, battery management apparatuses 110-2 and 110-3. For example, the battery management apparatus 110-1 transmits sensing data of the battery 120-1 to the battery management apparatuses 110-2 and 110-3. The battery management apparatus 110-1 receives $SOC_{t\_1}$ #2 corresponding to reference battery information from the battery management apparatus 110-2 and $SOC_{t\_1}$ #3 corresponding to reference battery information from the battery management apparatus 110-3. The battery management apparatus 110-1 determines whether an abnormality is present in the SOC estimating function of the battery management apparatus 110-1 based on $SOC_{t\_1}$ #1, $SOC_{t\_1}$ #2, and $SOC_{t\_1}$ #3. When it is determined that an abnormality is present in the SOC estimating function of the battery management apparatus 110-1, the battery management apparatus 110-1 determines substitute battery information to be an SOC of the battery 120-1 instead of $SOC_{t\_1}$ #1. In this example, the substitute battery information is an average of $SOC_{t\_1}$ #2 and $SOC_{t\_1}$ #3.

The battery management system 820 determines a maximum value or a minimum value of state information of the batteries 120-1 through 120-$n$ to be state information of the battery pack 810. The battery management system 820 transmits the state information of the battery pack 810 to an ECU or a VCU. As illustrated in FIG. 9, the ECU or the VCU displays the state information of the battery pack 810 on a display of the vehicle 800. The display includes, for example, a dashboard and/or a head-up display (HUD).

In an example, the ECU or the VCU transmits the state information of the battery pack 810 to a terminal of a user through a wireless communication interface of the vehicle 800. The user verifies the state information of the battery pack 810 or the state information of a battery cell included in the battery pack 810 at an external area of the vehicle 800.

Since the description of FIGS. 1 through 7 is also applicable here, repeated description of FIGS. 8 and 9 will be omitted.

The battery system 100 and the battery management system 110 in FIGS. 1-9 that perform the operations described in this application are implemented by hardware components configured to perform the operations described in this application that are performed by the hardware components. Examples of hardware components that may be used to perform the operations described in this application where appropriate include controllers, sensors, generators, drivers, memories, comparators, arithmetic logic units, adders, subtractors, multipliers, dividers, integrators, and any other electronic components configured to perform the operations described in this application. In other examples, one or more of the hardware components that perform the operations described in this application are implemented by computing hardware, for example, by one or more processors or computers. A processor or computer may be implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices that is configured to respond to and execute instructions in a defined manner to achieve a desired result. In one example, a processor or computer includes, or is connected to, one or more memories storing instructions or software that are executed by the processor or computer. Hardware components implemented by a processor or computer may execute instructions or software, such as an operating system (OS) and one or more software applications that run on the OS, to perform the operations described in this application. The hardware components may also access, manipulate, process, create, and store data in response to execution of the instructions or software. For simplicity, the singular term "processor" or "computer" may be used in the description of the examples described in this application, but in other examples multiple processors or computers may be used, or a processor or computer may include multiple processing elements, or multiple types of processing elements, or both. For example, a single hardware component or two or more hardware components may be implemented by a single processor, or two or more processors, or a processor and a controller. One or more hardware components may be implemented by one or more processors, or a processor and a controller, and one or more other hardware components may be implemented by one or more other processors, or another processor and another controller. One or more processors, or a processor and a controller, may implement a single hardware component, or two or more hardware components. A hardware component may have any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

The methods that perform the operations described in this application are performed by computing hardware, for example, by one or more processors or computers, implemented as described above executing instructions or software to perform the operations described in this application that are performed by the methods. For example, a single operation or two or more operations may be performed by a single processor, or two or more processors, or a processor and a controller. One or more operations may be performed by one or more processors, or a processor and a controller, and one or more other operations may be performed by one or more other processors, or another processor and another controller. One or more processors, or a processor and a controller, may perform a single operation, or two or more operations.

Instructions or software to control a processor or computer to implement the hardware components and perform the methods as described above are written as computer programs, code segments, instructions or any combination thereof, for individually or collectively instructing or configuring the processor or computer to operate as a machine or special-purpose computer to perform the operations performed by the hardware components and the methods as described above. In one example, the instructions or software include machine code that is directly executed by the processor or computer, such as machine code produced by a compiler. In another example, the instructions or software include higher-level code that is executed by the processor or computer using an interpreter. The instructions or software may be written using any programming language based on the block diagrams and the flow charts illustrated in the drawings and the corresponding descriptions in the specification, which disclose algorithms for performing the operations that are performed by the hardware components and the methods as described above.

The instructions or software to control a processor or computer to implement the hardware components and perform the methods as described above, and any associated data, data files, and data structures, are recorded, stored, or fixed in or on one or more non-transitory computer-readable storage media. Examples of a non-transitory computer-readable storage medium include read-only memory (ROM), random-access programmable read only memory (PROM), electrically erasable programmable read-only memory (EEPROM), random-access memory (RAM), dynamic random access memory (DRAM), static random access memory (SRAM), flash memory, non-volatile memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, blue-ray or optical disk storage, hard disk drive (HDD), solid state drive (SSD), flash memory, a card type memory such as multimedia card micro or a card (for example, secure digital (SD) or extreme digital (XD)), magnetic tapes, floppy disks, magneto-optical data storage devices, optical data storage devices, hard disks, solid-state disks, and any other device that is configured to store the instructions or software and any associated data, data files, and data structures in a non-transitory manner and providing the instructions or software and any associated data, data files, and data structures to a processor or computer so that the processor or computer can execute the instructions.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A battery management method performed by a battery management apparatus, the method comprising:
    selecting a function to be verified from among plural functions of the battery management apparatus;
    obtaining an execution result information by performing the selected function based on input information;
    transmitting the input information to at least one counterpart battery management apparatus;
    receiving, from the counterpart battery management apparatus, reference battery information, wherein the reference battery information is generated by the counterpart battery management apparatus performing same function as the selected function based on the input information; and
    determining whether an abnormality is present in the selected function based on the execution result information and the received reference battery information, wherein the determining comprises calculating a value of difference between the execution result information and the received reference battery information, and determining that the abnormality is present in the selected function in response to the calculated value being greater than a threshold.

2. The battery management method of claim 1, further comprising:
    determining substitute battery information based on the execution result information and the reference battery information in response to a determination that the abnormality is present in the selected function; and
    changing the execution result information to the determined substitute battery information.

3. The battery management method of claim 2, wherein the substitute battery information corresponds to a result of a calculation performed based on information selected from the execution result information and the reference battery information.

4. The battery management method of claim 2, wherein the substitute battery information corresponds to an average of the execution result information and the reference battery information.

5. The battery management method of claim 1, wherein the selecting comprises:
   selecting a function corresponding to a current ordinal position for verification by referencing a table in which a verification order of a portion or all of the plural functions is recorded.

6. The battery management method of claim 1,
   wherein the counterpart battery management apparatus is selected by the battery management apparatus from battery management apparatuses based on at least one of a response speed and identification information of each of the battery management apparatuses.

7. The battery management method of claim 1, wherein a main board of the battery management apparatus differs from a main board of the counterpart battery management apparatus.

8. A non-transitory computer-readable storage medium storing instructions that, when executed by one or more processors, cause the one or more processors to perform the battery management method of claim 1.

9. A battery management apparatus comprising:
   one or more processors configured to:
      select a function to be verified from plural functions of the battery management apparatus;
      obtain an execution result information by performing the selected function based on input information;
      transmit the input information to at least one counterpart battery management apparatus;
      receive, from the counterpart battery management apparatus, reference battery information, wherein the reference battery information is generated by the counterpart battery management apparatus performing same function as the selected function based on the input information; and
      determine whether an abnormality is present in the selected function based on the execution result information and the received reference battery information,
   wherein the one or more processors are further configured to calculate a value of difference between the execution result information and the received reference battery information, and determine that the abnormality is present in the selected function in response to the calculated value being greater than a threshold.

10. The battery management apparatus of claim 9, wherein, in response to a determination that the abnormality is present in the selected function, the one or more processors are further configured to determine substitute battery information based on the execution result information and the reference battery information and change the execution result information to the determined substitute battery information.

11. The battery management apparatus of claim 10, wherein the substitute battery information corresponds to a result of a calculation performed based on information selected from the execution result information and the reference battery information.

12. The battery management apparatus of claim 10, wherein the substitute battery information corresponds to an average of the execution result information and the reference battery information.

13. The battery management apparatus of claim 10, wherein the one or more processors are configured to select a current function corresponding to a current ordinal position for verification by referencing a table in which a verification order of a portion or all of the plural functions is recorded.

14. The battery management apparatus of claim 9, wherein the counterpart battery management apparatus is selected by the one or more processors from battery management apparatuses based on at least one of a determined response speed and determined identification information of each of the battery management apparatuses.

15. The battery management apparatus of claim 9, wherein a main board of the battery management apparatus differs from a main board of the counterpart battery management apparatus.

16. A battery management system, comprising:
   a battery management apparatus; and
   at least one counterpart battery management apparatus configured to communicate with the battery management apparatus,
   wherein the battery management apparatus is configured to select a function to be verified from among plural functions of the battery management apparatus, obtain an execution result information by performing the selected function based on input information, transmit the input information to at least one counterpart battery management apparatus, receive, from the counterpart battery management apparatus, reference battery information, and determine whether an abnormality is present in the selected function based on the execution result information and the received reference battery information,
   wherein the reference battery information is generated by the counterpart battery management apparatus performing same function as the selected function based on the input information, and
   wherein the battery management apparatus is further configured to calculate a value of difference between the execution result information and the received reference battery information; and determine that the abnormality is present in the selected function in response to the calculated value being greater than a threshold.

17. A battery system, comprising:
   plural battery management apparatuses connected to batteries, respectively, wherein each of the battery management apparatuses is configured to:
      perform a first function on a first battery to obtain a first execution result;
      select at least one counterpart battery management apparatus, from among the plural battery management apparatuses, to perform the first function on the first battery to obtain a counterpart execution result, wherein the counterpart execution result is generated based on input information used to obtain the first execution result;
      calculate a value of difference between the first execution result and the counterpart execution result; and
      determine whether the first execution result is abnormal in response to the calculated value being greater than a threshold.

18. The battery system of claim 17, wherein a first battery management apparatus is further configured to substitute a corresponding first execution result for a corresponding counterpart execution result when the corresponding first result is determined to be abnormal.

19. The battery system of claim 17, wherein the selecting of the at least one counterpart battery management apparatus comprises selecting multiple counterpart battery management apparatuses to perform the first function on the first battery.

20. The battery system of claim 19, wherein respective execution results of the plural multiple counterpart battery management apparatuses for the first function are used to calculate a statistic value to obtain the counterpart execution result.

21. The battery system of claim 20, wherein the battery management apparatus is further configured to perform a second function.

22. The battery system of claim 21, wherein the first function or the second function is any one or any combination of any two or more of a sensing function, a state estimating function, and a cell balancing function.

* * * * *